United States Patent [19]

Nostrand et al.

[11] 4,166,918
[45] Sep. 4, 1979

[54] METHOD OF REMOVING THE EFFECTS OF ELECTRICAL SHORTS AND SHUNTS CREATED DURING THE FABRICATION PROCESS OF A SOLAR CELL

[75] Inventors: Gerald E. Nostrand, Jamesburg; Joseph J. Hanak, Lawrenceville, both of N.J.

[73] Assignee: RCA Corporation, New York, N.Y.

[21] Appl. No.: 926,083

[22] Filed: Jul. 19, 1978

[51] Int. Cl.² ............................................ H01L 31/04
[52] U.S. Cl. ............................. 136/89 R; 136/89 TF; 357/2; 357/30
[58] Field of Search ........... 136/89 R, 89 CC, 89 TF; 357/30, 2

[56] References Cited

U.S. PATENT DOCUMENTS

| | | | |
|---|---|---|---|
| 3,436,275 | 4/1969 | Tsao et al. | 148/1.5 |
| 3,597,281 | 8/1971 | Webb et al. | 136/206 |
| 3,630,627 | 12/1971 | Low et al. | 356/222 |
| 3,843,420 | 10/1974 | Gittleman et al. | 148/31.55 |
| 3,919,589 | 11/1975 | Hanak | 315/71 |
| 4,064,521 | 12/1977 | Carlson | 357/2 |
| 4,071,426 | 1/1978 | Pinch et al. | 204/192 F |
| 4,127,424 | 11/1978 | Ullery, Jr. | 136/89 P |

OTHER PUBLICATIONS

J. J. Hanak et al., "Calculation of Composition of Dilute Cosputtered Multicomponent Films", *J. Appl. Phys.*, vol. 44, pp. 5142-5147 (1973).

C. R. Wronski et al., "Granular Metal-Semiconductor Schottky Barriers", *J. Appl. Phys.*, vol. 45, pp. 295-299 (1974).

C. R. Wronski, "Electronic Properties of Amorphous Silicon in Solar Cell Operation", *IEEE Trans. Electron Devices*, vol. ED-24, pp. 351-357 (1977).

J. J. Hanak et al., "Calculation of Deposition Profiles & Compositional Analysis of Cosputtered Films", *J. Appl. Phys.*, vol. 43, pp. 1666-1673 (1972).

D. E. Carlson, "Amorphous Silicon Solar Cells", *IEEE Trans. Electron Devices*, vol. ED-24, pp. 449-453 (1977).

J. J. Hanak, "The Multiple-Sample Concept in Materials Research", *J. Materials Sci.*, vol. 5, pp. 964-971 (1970).

*Primary Examiner*—Aaron Weisstuch
*Attorney, Agent, or Firm*—Birgit E. Morris; A. Stephen Zavell

[57] ABSTRACT

A method of removing the effects of electrical shorts and shunts created during the fabrication process and improving the performance of a solar cell with a thick film cermet electrode opposite to the incident surface by applying a reverse bias voltage of sufficient magnitude to burn out the electrical shorts and shunts but less than the break down voltage of the solar cell.

10 Claims, 2 Drawing Figures

METHOD OF REMOVING THE EFFECTS OF ELECTRICAL SHORTS AND SHUNTS CREATED DURING THE FABRICATION PROCESS OF A SOLAR CELL

The invention described herein was made in the performance of an Energy Research And Development Administration Contract #EY-76-C-03-1286.

This invention relates to a method of improving the performance of solar cells. More specifically, this invention relates to a method of removing the electrical shorts and shunts created during the fabrication process of the solar cells.

CROSS REFERENCE TO RELATED APPLICATION

"Inverted Amorphous Silicon Solar Cell Utilizing Cermet Layers", Ser. No. 899,564, by Joseph John Hanak, filed Apr. 24, 1978, incorporated herein by reference.

BACKGROUND OF THE INVENTION

The voltage and current output of thin film solar cells, e.g., amorphous silicon solar cells such as those described in U.S. Pat. No. 4,064,521 or screen printed solar cells, may be greatly reduced or completely eliminated by electrical shorts or shunts formed during the fabrication of the solar cell. Electrical shorts occur when there is a pinhole in the semiconductor body and the front and back electrodes are touching. A shunt is the loss of charge in the semiconductor body due to imperfect barrier formation or the formation of an ohmic contact by a high-work function metal rather than a Schottky barrier formation. The problems of solar cell defects which cause shorts or shunts greatly increase with increasing solar cell size.

If large area solar cells are to be economically feasible, then methods to either eliminate these shorts and shunts during fabrication or a method of removing the defects after processing must be developed. Since the former will require facilities and processing conditions which greatly increase the cost of solar cells, the latter, a method of removing shorts and shunts, is preferable. The present process for removal of a defect in solar cells made from gallium arsenide, cadmium telluride, single crystal or amorphous silicon and the like, requires the etching out of the defect in the solar cell. Attempts made to remove the defects by the application of a reverse bias voltage tended to increase the incidence of shorts and shunts in the solar cell.

Solar cells incorporating a thick film metal cermet are disclosed in copending application Ser. No. 899,564, filed Apr. 24, 1978. Cermets are composite materials consisting of finely dispersed mixtures of immiscible metals and insulators. Cermet-containing amorphous silicon solar cells exhibit increased resistance to defects form shorts and shunts in comparison to conventional solar cells. However, cermet solar cells are subject to the same performance degrading effects as conventional solar cells as the cell area increases. Thus, it would be highly desirable to find a method of removing the effect of electrical shorts and shunts created during the fabrication process.

SUMMARY OF THE INVENTION

Defects in a solar cell which incorporates a thick film cermet ohmically contacting the active region of the solar cell opposite to the surface incident to solar radiation are eliminated according to the invention by the application of a reverse bias voltage which is sufficient to burn out electrical shorts and shunts, but less than the breakdown voltage of the solar cell.

DETAILED DESCRIPTION OF THE INVENTION

Solar cells which incorporate a thick film cermet ohmically contacting the active region opposite to the incident surface can have the electrical shorts or shunts burnt out through the application of a reverse bias voltage. The active region is defined as that region within which the solar radiation is absorbed and converted into electrons and holes. A reverse bias voltage is defined as a voltage of opposite polarity to the voltage at which the solar cell operates during irradiation with solar radiation.

Very large defects should be etched out by conventional methods known in the art, prior to the application of the reverse bias potential, to prevent the solar cell from burning out. The burn out voltage provides the upper limit of the potential that is applied to the large area solar cell during the practice of the invention.

Suitable thick film cermets for use in solar cells have the formula $$M_x I_{(1-x)}$$

wherein M is a metal, I is an insulator or a ceramic insulator, and x is the total volume of the cermet which is metal. The insulator, I, is selected, inter alia, from the group consisting of $SiO_2$, $Al_2O_3$, $Si_3N_4$, BN, MgO, $TiO_2$, $ZrO_2$, silicon oxynitride, and ceramics which have bandgaps higher than about 4 eV and are transparent to visible light at all wavelengths, and the like. The metal concentration x can vary from about 0.10 to about 0.85 and preferably is from about 0.25 to about 0.45. Suitable metals for the thick film cermet include nickel, niobium, molybdenum, tungsten, titanium, and the like.

Figure 1:
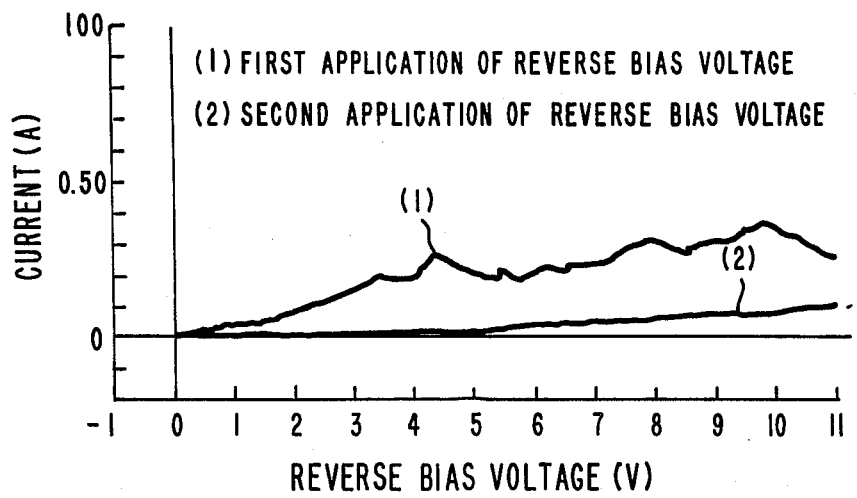
FIG. 1 is a graph of the current versus reverse bias voltage taken in the dark for a thick film cermet solar cell about 40 cm$^2$ in size, measured initially and after a second application of a reverse bias voltage.

The thick film cermet tends to localize the effect of shorts and shunts formed during the fabrication of the solar cell. The application of reverse bias potential apparently burns out those areas of the solar cell which have defects, thus improving the current and voltage output of the solar cell. As illustrated by FIG. 1, curve 1, increasing the reverse bias voltage results in a gradual increase of the current. However, the current increase is not uniform but shows sporadic discontinuous decreases in the current. The current decreases denote the burning out of defects. This procedure can be continued up to a reverse bias voltage wherein the cell would break down and burn up.

The reverse bias voltage for a given cell is determined experimentally on smaller cells of the same construction by applying a reverse bias voltage until the solar cell burns out. A second scan of the solar cell, shown by curve 2, having undergone the reverse bias voltage, shows a greatly reduced dark current in the current-voltage curve.

Figure 2:
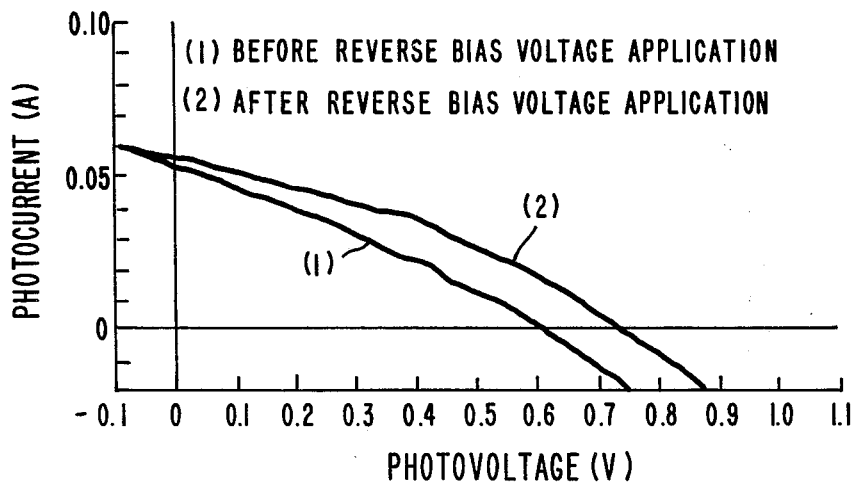
FIG. 2 is a graph of the photocurrent versus photovoltage of a thick film cermet solar cell before and after the application of a reverse bias voltage.

FIG. 2 illustrates the increase in photocurrent for a treated solar cell. Curve 1 shows a graph of photocurrent versus photovoltage before treatment and curve 2 is a similar graph after the application of the reverse bias voltage. The solar cell of curve 2 exhibits greater photocurrents than the solar cell of curve 1 for any positive photovoltage.

In accordance with the method of the invention, the reverse bias voltage is applied by contacting the solar cell electrodes to a power source and applying a voltage sufficient to burn out the shorts and shunts but less than the breakdown voltage of the cell. The reverse bias voltage can be applied to the solar cell as a pulse, step wise increase, or linear increase. The only limitation to the speed of voltage increase is that the voltage application be of sufficient duration to heat and burn out the defect. Usually, the voltage is increased from about 0 volts to just below the breakdown voltage at increments of about 5 volts per minute or faster during production operations. However, the voltage may be increased at increments of about 1 volt per minute or less. As a precaution against creating further shorting and shunting, the solar cell can be immersed in a liquid cooling medium such as water, ethylene glycol, and the like, during the application of the reverse bias voltage.

As an example, the graphs illustrated by FIGS. 1 and 2 were generated by a solar cell fabricated according to the following procedure: a glass substrate was cleaned and washed in an ultrasonic bath and thereafter rinsed with water and dried by dust free hot air at about 100° C. Indium tin oxide was radio frequency (RF) sputtered onto the glass substrate to a resistance of about 100 ohms/□. The RF generator was operated at a frequency of about 15.6 megahertz (MHz). The sputtering targets were discs 14.6 cms in diameter. Thereafter, a mica mask was made to cover a narrow border around the substrate to prevent the deposition of the subsequent films on the indium tin oxide and to provide a space for a wire or suitable current withdrawing means to be attached thereto. The system was pumped down to about $5 \times 10^{-7}$ Torr and the substrate was heated to about 230° C. and argon was bled into the system at a rate of about 5 sccm and maintained such that there was an argon pressure of about 5 Torr in the sputtering chamber. The target was presputtered with a shutter over the substrate for 15 minutes and thereafter the shutter was opened and the sputtering continued for about 1.2 minutes during which time about 80 angstroms of $Pt-SiO_2$ cermet with a platinum concentration of about 25% to about 40% of the total cermet volume was deposited. With the system pressure at $5 \times 10^{-7}$ Torr, the substrate was further heated to about 330° C. and the appropriately doped layers of amorphous silicon were applied in accordance with U.S. Pat. No. 4,064,521, herein incorporated by reference. About 25 seconds was required to deposit about 200 angstroms of P+-type hydrogenated amorphous silicon. An intrinsic layer was deposited to a thickness of about 5,000 angstroms in about 11 minutes. An N+-type layer of hydrogenated amorphous silicon was deposited on the intrinsic amorphous silicon to a thickness of about 900 angstroms in about 2 minutes. For the deposition of the amorphous silicon layers the flow of $SiH_4$ was 20 sccm. For P+ doping 0.05 $B_2H_6$ was added to the $SiH_4$ and for the N+ doping 0.1% $PH_3$ was used. The total pressure of the gases during the deposition of the amorphous silicon layers was about $20\mu$. RF power of 80 W was used.

The thick film cermet layer was deposited onto the amorphous silicon layer to a thickness of about 9,000 angstroms by RF sputtering from a target of $Ni-SiO_2$ cermet containing from about 40% to about 55% nickel.

After the deposition of the thick film cermet, the mask was removed and a smaller mask put on the amorphous silicon solar cell. About 5,000 angstroms of aluminum was applied to the thick film cermet during 30 minutes of RF sputtering and subsequently a wire was attached to the aluminum layer to apply the reverse bias voltage or withdraw the current generated during the illumination of the solar cell.

Our invention provides a low cost and efficient method for improving the performance of solar cells incorporating a thick film cermet. It is to be understood that we do not intend to limit our invention solely to the example described herein but rather it is out intention to include such modifications as would be obvious to the ordinary worker skilled in the designing of solar cells.

We claim:

1. A method of improving the performance of a solar cell which incorporates a thick film cermet electrode contacting the active region of said solar cell opposite to a surface incident to solar radiation comprising:
   applying a reverse bias voltage of sufficient magnitude to burn out the defects in said solar cell but less than the breakdown voltage of said cell.

2. A method according to claim 1 wherein the reverse bias voltage is applied as a voltage pulse from 0 volts to below the breakdown voltage.

3. A method according to claim 1 wherein the reverse bias voltage is increased at a rate of about 1 volt per minute.

4. A method according to claim 1 wherein the reverse bias voltage is increased at a rate of about 5 volts per minute.

5. A method according to claim 1 wherein said solar cell is a hydrogenated amorphous silicon solar cell.

6. The method according to claim 5 wherein said bias voltage is increased at a rate of about 1 volt per minute.

7. The method according to claim 5 wherein said bias voltage is increased at a rate of about 5 volts per minute.

8. A method according to claim 5 wherein the reverse bias voltage is applied as a voltage pulse from 0 volts to below the breakdown voltage.

9. The method according to claim 10 wherein M is selected from the group consisting of nickel, niobium, molybdenum, tungsten, and titanium and I is selected from the group consisting of $SiO_2$, $Al_2O_3$, $Si_3N_4$, BN, MgO, $TiO_2$, $ZrO_2$, silicon oxynitride and ceramics which have bandgaps higher than about 4 eV.

10. The method according to claim 1 or 5 wherein the cermet has the formula $M_xI_{1-x}$, wherein x varies from about 0.10 to about 0.85, M is a metal, and I is an insulator.

* * * * *

UNITED STATES PATENT AND TRADEMARK OFFICE
CERTIFICATE OF CORRECTION

PATENT NO. : 4,166,918

DATED : September 4, 1979

INVENTOR(S) : Gerald Everett Nostrand et al.

It is certified that error appears in the above-identified patent and that said Letters Patent is hereby corrected as shown below:

Column 1, line 58: "form" should be --from--;

Signed and Sealed this

Twenty-eighth Day of July 1981

[SEAL]

Attest:

GERALD J. MOSSINGHOFF

Attesting Officer

Commissioner of Patents and Trademarks